US007145286B2

(12) United States Patent
Beck et al.

(10) Patent No.: US 7,145,286 B2
(45) Date of Patent: *Dec. 5, 2006

(54) WEDGE SHAPED UNIFORM ENERGY MEGASONIC TRANSDUCER

(75) Inventors: Mark J. Beck, Los Gatos, CA (US); Richard B. Vennerbeck, Los Gatos, CA (US); Raymond Y. Lillard, Redwood City, CA (US); Eric G. Liebscher, San Jose, CA (US)

(73) Assignee: Product Systems Incorporated, Campbell, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/228,600

(22) Filed: Sep. 16, 2005

(65) Prior Publication Data

US 2006/0006766 A1 Jan. 12, 2006

Related U.S. Application Data

(62) Division of application No. 10/939,792, filed on Sep. 13, 2004, now Pat. No. 6,946,774, which is a division of application No. 10/286,578, filed on Nov. 1, 2002, now Pat. No. 6,791,242.

(51) Int. Cl.
*H01L 41/08* (2006.01)

(52) U.S. Cl. ........................................ 310/367; 134/1.3

(58) Field of Classification Search ................ 310/316, 310/317, 367; 134/1.3
See application file for complete search history.

(56) References Cited

U.S. PATENT DOCUMENTS

| | | | | |
|---|---|---|---|---|
| 3,179,823 | A * | 4/1965 | Nesh | 310/329 |
| 4,549,533 | A * | 10/1985 | Cain et al. | 601/2 |
| 4,617,488 | A * | 10/1986 | Nakamura et al. | 310/321 |
| 5,462,604 | A * | 10/1995 | Shibano et al. | 134/1 |
| 6,057,632 | A * | 5/2000 | Ustuner | 310/334 |
| 6,217,530 | B1 * | 4/2001 | Martin et al. | 601/2 |
| 6,222,305 | B1 * | 4/2001 | Beck et al. | 310/334 |
| 6,791,242 | B1 * | 9/2004 | Beck et al. | 310/367 |
| 2003/0020564 | A1 * | 1/2003 | Nishimura | 333/187 |
| 2004/0027035 | A1 * | 2/2004 | Namerikawa et al. | 310/367 |

* cited by examiner

*Primary Examiner*—Thomas M. Dougherty
(74) *Attorney, Agent, or Firm*—Donald J. Pagel

(57) ABSTRACT

A transducer comprising an acoustic energy generating means and a resonator. The acoustic energy generating means generates acoustic energy and is adapted for delivering an approximately uniform amount of acoustic energy to each unit of surface area on a substrate in a given time period when the substrate is rotating. The acoustic energy generating means has a surface area that is less than the surface area of the substrate, and may comprise two or more piezoelectric crystal segments that are separately controllable with respect to power and/or time. When assembled, the two more piezoelectric crystal segments give the acoustic energy generating means a rectangular shape, a wedge shape or a triangle shape. The resonator is attached to the acoustic energy generating means for transmitting the acoustic energy to the substrate.

12 Claims, 8 Drawing Sheets

WEDGE SHAPED UNIFORM ENERGY MEGASONIC TRANSDUCER

This is a division of application Ser. No. 10/939,792, filed Sep. 13, 2004, now U.S. Pat. No. 6,946,774, which is a division of application Ser. No. 10/286,578, filed Nov. 1, 2002, now U.S. Pat. No. 6,791,242. Application Ser. No. 10/939,792 is incorporated herein by reference.

BACKGROUND OF THE INVENTION

1. Technical Field

The present invention relates to transducers that generate acoustic energy in the frequency range around one megahertz and more particularly to a system that delivers a uniform amount of acoustic energy to the surface of a rotating object.

2. Background Information

It is well-known that sound waves in the frequency range of 0.4 to 2.0 megahertz (MHz) can be transmitted through liquids and used to clean particulate matter from damage sensitive substrates. Since this frequency range is predominantly near the megahertz range, the cleaning process is commonly referred to as megasonic cleaning. Among the items that can be cleaned in this manner are semiconductor wafers in various stages of the semiconductor device manufacturing process, disk drive media, including compact disks and optical disks, flat panel displays and other sensitive substrates.

Megasonic acoustic energy is generally created by exciting a crystal with radio frequency AC voltage. The acoustic energy generated by the crystal is coupled through an energy transmitting member (a resonator) and into a fluid. Frequently, the energy transmitting member is a wall of the vessel that holds the fluid, and a plurality of objects are placed in the vessel for cleaning. For example, U.S. Pat. No. 5,355,048, discloses a megasonic transducer comprised of a piezoelectric crystal attached to a quartz window (resonator) by several attachment layers. The megasonic transducer operates at approximately 850 KHz. Similarly, U.S. Pat. No. 4,804,007 discloses a megasonic transducer in which energy transmitting members comprised of quartz, sapphire, boron nitride, stainless steel or tantalum are glued to a piezoelectric crystal using epoxy.

It is also known that megasonic cleaning systems can be used to clean single objects, such as individual semiconductor wafers. For example, U.S. Pat. No. 6,021,785 discloses the use of a small ultrasonic transmitter positioned horizontally adjacent to the surface of a rotating wafer. A stream of water is ejected onto the surface of the wafer and used to both couple the acoustic energy to the surface of the disk for sonic cleaning and to carry away dislodged particles. Similarly, U.S. Pat. No. 6,039,059 discloses the use of a solid cylindrically-shaped probe that is placed close to a surface of a wafer while cleaning fluid is sprayed onto the wafer and megasonic energy is used to excite the probe. In another example, U.S. Pat. No. 6,021,789 discloses a single wafer cleaning system that uses a plurality of transducers arranged in a line. A liquid is applied to a surface of the wafer and the transducers are operated so as to produce a progressive megasonic wave that carries dislodged particles out to the edge of the wafer.

SUMMARY OF THE PRESENT INVENTION

Briefly, the present invention is a transducer that delivers an approximately uniform amount of acoustic energy to every point on the surface of a rotating object. The transducer comprises a piezoelectric crystal attached to a resonator. Electrically conductive layers on both sides of the crystal are used to create an electric field which drives the crystal. Preferably, the transducer generates acoustic energy in the frequency range of 0.4 to 2.0 MHz.

In one embodiment, the crystal in the transducer is wedge shaped so that the active acoustic surface area of the crystal increases as the radius of the rotated object increases. This means that the amount of acoustic energy delivered to the object increases with increasing radius. However, since the time that a region of the object spends under the transducer varies inversely with the radius, the total amount of acoustic energy delivered to each unit of surface area on the surface of the object is the same. This is useful in situations where the acoustic energy is used to assist some type of chemical reaction (e.g. sonochemistry) occurring on the surface of the object, and it is desired to have the chemical reaction proceed uniformly over the whole surface. It is also useful where uniform acoustic cleaning of the object is desired, as well as in other situations where uniform exposure to the megasonic acoustic energy is desired.

In another embodiment, the crystal has a rectangular shape, but the electrically conductive layers on both sides of the crystal are given the wedge shape. This causes the crystal to deliver an amount of acoustic energy to the object that increases with increasing radius, just as if the crystal itself had the wedge shape.

DETAILED DESCRIPTION OF THE INVENTION

Figure 1:
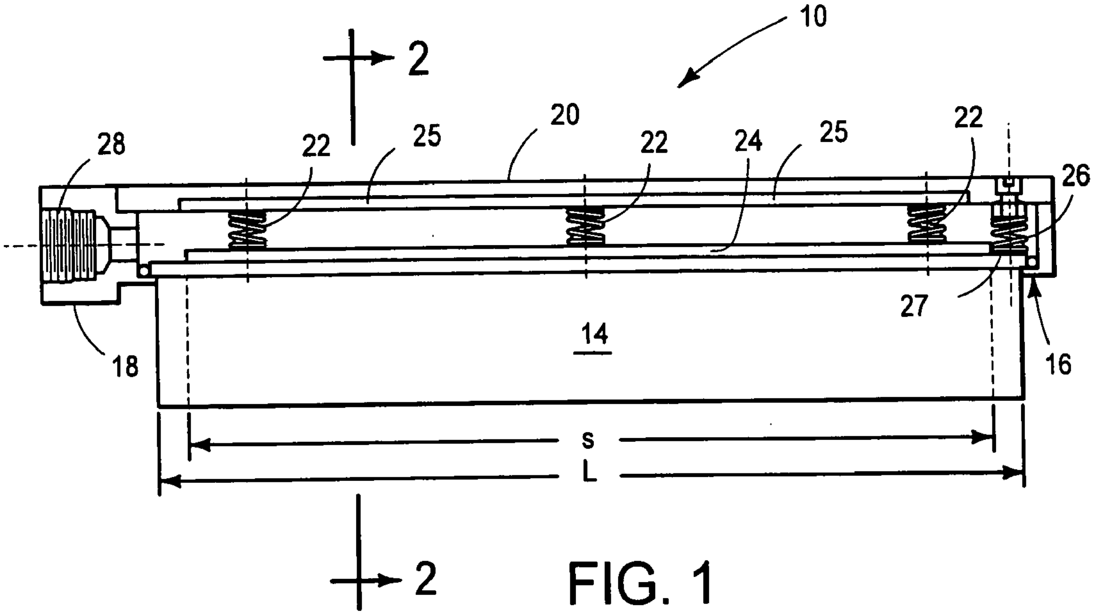
FIG. 1 is a side view of the acoustic transducer according to the present invention.

FIG. 1 illustrates an acoustic transducer 10 comprised of a resonator 14 and a transducer housing 16. The housing 16 comprises a body 18 and a cover plate 20. In the preferred embodiment, the housing 16 is made from stainless steel, but other materials such as plastics, ceramics, quartz or aluminum can be used. In a representative configuration, the resonator has a length "L". A plurality of first spring connectors 22 are positioned between a crystal 24 and a printed circuit board (PCB) 25. One or more second spring connectors 26 contact a step region 27. An aperture 28 in an end of the housing 16 is sized to accept an electrical connection or an electrical connector such as a standard BNC or a standard radio frequency (RF) connector.

Figure 2:
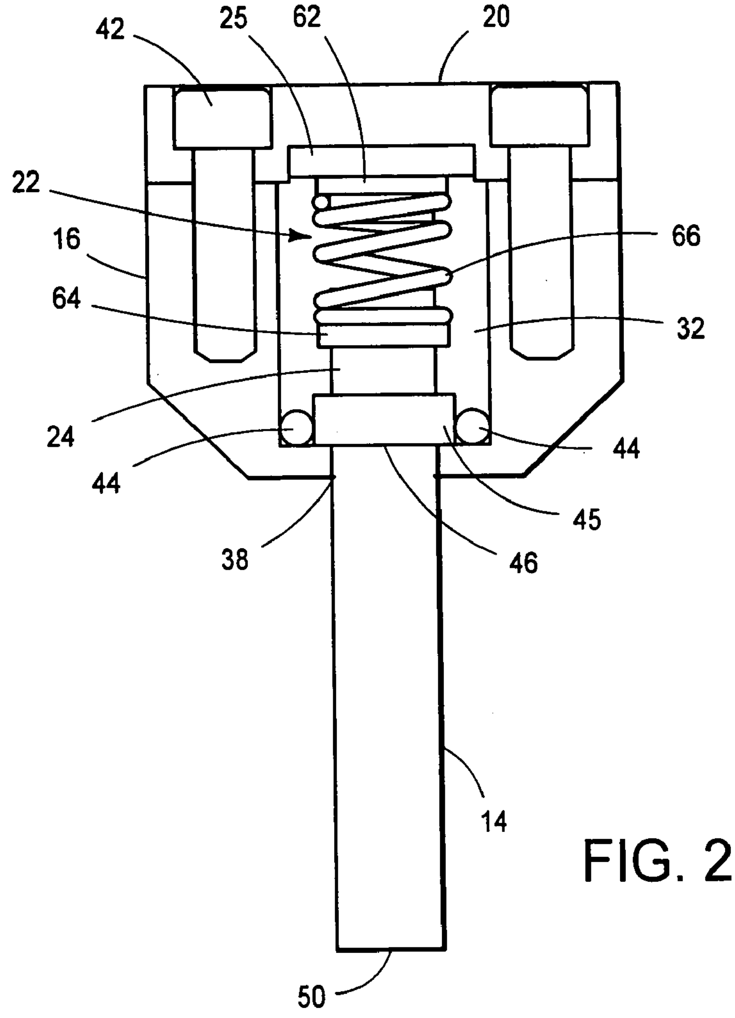
FIG. 2 is a cross-sectional view of the acoustic transducer taken along the line 2—2 of FIG. 1.

FIG. 2 illustrates that the body 18 includes a cavity 32 which holds one or more piezoelectric crystals 34. The resonator 14 extends through a slot 38 and up into the body 18 where it is attached to the crystal 24. The cover plate 20 is attached to the body 18 by attachment means 42, such as screws, bolts or other means, so as to form a liquid tight seal over the cavity 32. Preferably, the fit between the resonator 14 the slot 38 is tight enough to prevent liquid from getting into the cavity 32 through the slot 38. A gasket 44 functions to seal the cavity 32 from moisture, and also prevents any contaminants inside the cavity 32 from escaping. In some embodiments, a lip 45 is formed in the resonator 14 to help in sealing the cavity 32.

The resonator 14 includes a proximal end 46 and a distal end 50. The first spring connector 22 is positioned between the crystal 24 and the PCB 25. The spring connector 22 comprises a base button 62 and a contact button 64 with a spring 66 positioned between the buttons 62 and 64. The spring connector 22 is used to make electrical contact with the crystal 24 as is explained in more detail later.

Figure 3:
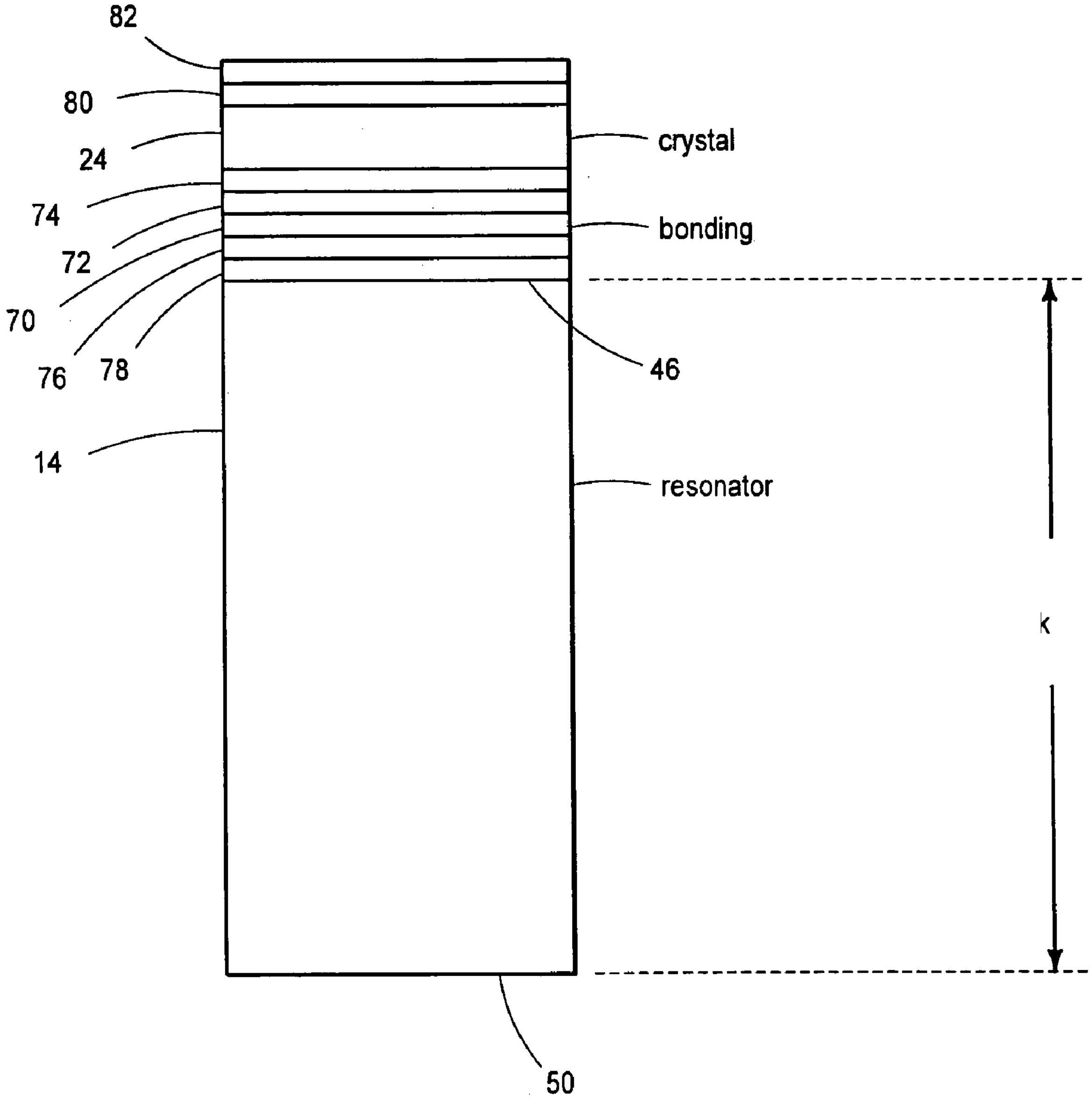
FIG. 3 is a schematic cross-sectional view of an acoustic transducer according to the present invention.

FIG. 3 shows that the resonator 14 is connected to the crystal 24 by a plurality of layers (not to scale). In one embodiment, the crystal 24 is connected to a bonding layer 70 by a first wetting layer 72 and a first adhesion layer 74. The first wetting layer 72 is positioned closest to the bonding layer 70 and the first adhesion layer 74 is positioned closest to the crystal 24. A second wetting layer 76 and a second adhesion layer 78 are positioned between the bonding layer 70 and the resonator 14. The second wetting layer 76 is positioned closest to the bonding layer 70 and the second adhesion layer 78 is positioned closest to the resonator 14. A third adhesion layer 80 is positioned on the opposite side of the crystal 24 from the first adhesion layer 74, and a metal layer 82 is positioned on the third adhesion layer 80.

In FIG. 3, the bonding layer 70 may comprise a solder-like material, such as indium, tin, alloys of indium or alloys of tin. Pure indium works particularly well as the bonding layer 70. The composition and purpose of the other layers shown in FIG. 3 are the same as the layers shown in FIG. 5 of U.S. Pat. No. 6,222,305. Specifically, the first and second wetting layers 72 and 76, may comprise silver and each have a thickness of approximately 5000 Å. However, other metals and/or thicknesses could be used for the wetting layers. The function of the wetting layers 72 and 76 is to provide a wetting surface for the molten indium (or tin) in the bonding layer 70, meaning that the wetting layers help the bonding layer 70 adhere to the first adhesion layer 74 and the second adhesion layer 78, respectively.

In one embodiment, the first, second and third adhesion layers 74, 78 and 80, each comprise an approximately 5000 Å thick layer of an alloy comprised of chrome and a nickel copper alloy. For example, the layers 74, 78 and 80 may be comprised of 50% chrome and 50% nickel copper alloy. Acceptable nickel copper alloys include the alloys marketed under the trademarks Nickel 400™ or MONEL™. Nickel 400™ and MONEL™ are copper nickel alloys comprised of 32% copper and 68% nickel. However, other materials and/or thicknesses could also be used as the adhesion layers 74, 78 and 80. For example, any or all of the layers 74, 78 and 80 may comprise chromium, including a chromium nickel alloy. The layer 80 is optional and can be eliminated completely. The layer 82 is preferably silver, but may comprise other conductive metals, including nickel or silver alloys.

In the preferred embodiment, the crystal 24 is a piezoelectric crystal such as a crystal comprised of lead zirconate titanate (PZT). However, many other piezoelectric materials such as barium titanate, quartz or polyvinylidene fluoride resin (PVDF), may be used as is well-known in the art. Preferably, the crystal 24 is capable of generating acoustic energy in the frequency range of 0.4 to 2.0 MHz.

The transducer 10 is constructed using the basic technique described in U.S. Pat. No. 6,222,305. If tin is used as the bonding layer 70, the higher melting point of tin must be taken into consideration.

Depending upon the requirements of a particular cleaning task, the composition of the resonator 14 is selected from a group of chemically inert materials. For example, inert materials that work well as the resonator 14 include sapphire, quartz, silicon carbide, silicon nitride, ceramics, stainless steel and aluminum. Additionally, the resonator 14 can be made chemically inert by coating a non-inert material with a chemically inert material such as the fluorinated polymers perfluoroalkoxy (PFA), polytetrafluoroethylene (PTFE), fluorinated ethylene-propylene (FEP), or tetrafluoroethylene (TFE) and other formulations, including the materials that are marketed under the trademark Teflon™; the fluorinated polymer ethylene chlorotrifluoroethylene (ECTFE), including the material marketed under the trademark Halar™; or the fluorinated polymer polyvinylidene fluoride (PVDF), including the material marketed under the trademark Kynar™.

Chemical inertness is desired because it is unacceptable for the resonator 14 to chemically react with the cleaning fluid. Thus, the material used as the resonator 14 is usually dictated, at least in part, by the nature of the cleaning fluid. Sapphire (preferably synthetic sapphire) is a desirable material for the resonator 14 when the items to be cleaned by the transducer 10 require parts per billion purity. For example, semiconductor wafers require this type of purity. A hydrofluoric acid (HF) based cleaning fluid might be used in a cleaning process of this type for semiconductor wafers.

The resonator 14 has a height "k". Generally, the height "k" is chosen so as to minimize reflectance of acoustic energy, such as by making "k" a multiple of one-half of the wavelength of the acoustic energy emitted by the crystal 24.

In addition to the layers shown in FIG. 3, it should be appreciated that there are many ways of connecting the resonator 14 to the crystal 24. For example, the resonator 14 may be connected to the crystal 24 using a combination layer in place of the layers 76 and 78. In this embodiment, the combination layer is a conductive silver emulsion (paste) that is applied to the resonator 14. An acceptable emulsion is the commercially available product referred to as the 2617D low temperature silver conductor, available from EMCA-REMAX Products, of Montgomeryville, Pa. The layer 140 is applied directly to the resonator 14 using screen printing techniques. In this embodiment, a region of the combination layer would be used in the step region 27 (shown in FIG. 1) to contact the spring connector 26.

In another embodiment, the resonator 14 is connected to the crystal 24 using epoxy. The epoxy is used in the bonding layer 70 in place of the solder-like materials described previously, and some or all of the layers 72, 74, 76 and 78 can be deleted. The epoxy may comprise any suitable electrically conductive epoxy, an electrically nonconductive epoxy or another non-epoxy type of adhesive that may be either electrically conductive or electrically nonconductive. Such an embodiment is described in more detail with respect to FIG. 12.

The transducer 10 is designed to deliver an approximately uniform amount of acoustic energy to each unit of surface area of a rotating substrate in a given time period. Typically, the substrate is circular in shape, such as the surface of a semiconductor wafer, so the dose (energy/unit time/unit area) of acoustic energy received by the substrate when it is rotating, varies in a direction that corresponds to the radius of the circular region. This is because the linear velocity of points on the surface of the rotating substrate increases with increasing radius. For noncircular substrates, the word radius applies to the axis of rotation which need not coincide with the center of the substrate. If, for example, a rectangular transducer is oriented along a radius of the substrate, then when the substrate is rotated, points farther out from the axis of rotation spend less time underneath the rectangular transducer than points nearer to the axis of rotation. This results in a lower dose for points further from the axis of rotation. Therefore, in order for the transducer 10 to deliver an approximately uniform amount of acoustic energy to each unit of surface area of the rotating substrate in a given time period, the transducer 10 must be designed to correct for the greater linear velocity of points farther from the axis of rotation of the rotating substrate. In this application, the variable linear velocity correction of the transducer 10 is obtained using one of four different methods. In a first method, the crystal 24 is shaped to provide the variable linear velocity correction. In a second method, the electrode layers on the surfaces of the crystal 24 are shaped to provide the variable linear velocity correction. In a third method, segments of the crystal 24 are driven at different power levels to provide the variable linear velocity correction. In a fourth method, combinations of methods one through three are used to provide the variable linear velocity correction.

Figure 4:
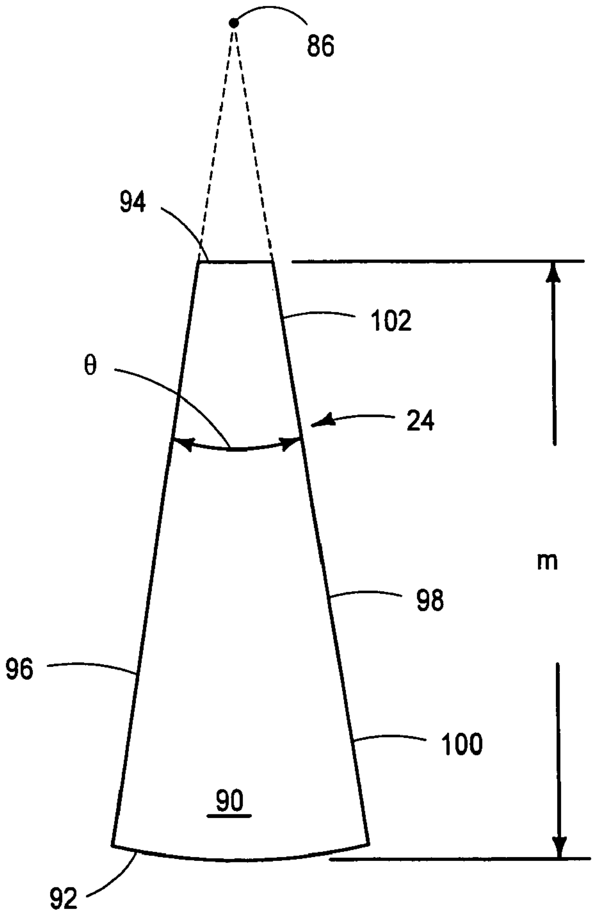
FIG. 4 is a schematic top view of a wedge-shaped crystal according to the present invention.

FIG. 4 illustrates the first method. In FIG. 4, the crystal 24 has a wedge shape 90. The wedge shape 90 comprises a curved side 92, a blunt side 94, a first tapered side 96 and a second tapered side 98. The wedge shape 90 has a wide end 100 adjacent to the curved side 92 and a narrow end 102 adjacent to the blunt side 94. An angle θ is formed between the sides 96 and 98. The wedge shape 90 is useful in situations where the transducer 10 needs to deliver an approximately equal amount of energy to each unit area on the surface of a rotating object in a given amount of time without using a transducer that covers the whole surface area of the object. Generally the wedge shape 90 covers forty percent or less of the surface area of the object, and in a typical transducer for use with the circular surface of a semiconductor wafer, the wedge shape 90 would cover approximately fifteen percent of the surface area.

Figure 6:
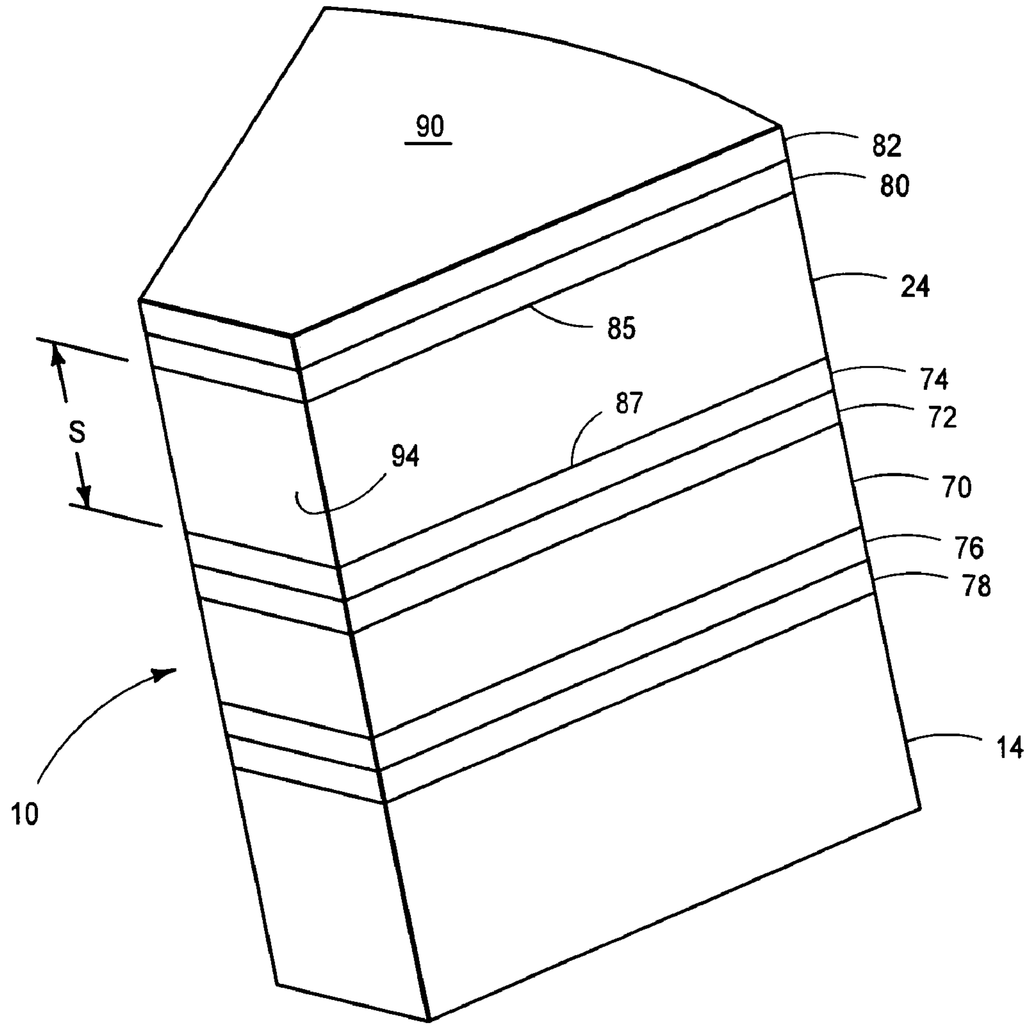
FIG. 6 is a schematic isometric view of the acoustic transducer according to the present invention.

FIG. 4 is a two-dimensional drawing showing a planar top surface 85 of the wedge shape 90. In this two-dimensional representation, the first tapered side 96 and the second tapered side 98 lie in the same plane and would intersect each other at a point 86 if they were extended past the blunt side 94. In the preferred embodiment, the sides 96 and 98 each have the same length "m". Similarly, the blunt side 94 and the curved side 92 are coplanar with each other and with the sides 96 and 98. FIG. 6 illustrates that the wedge shape 90 is three-dimensional, not two-dimensional, with the wedge shape 90 having a thickness "s" that extends in a direction perpendicular to the planar top surface 85. A planar bottom surface 87 forms the bottom of the wedge shape 90, with the planar bottom surface 87 being parallel to the planar top surface 85 and having the same shape as the planar top surface 85.

It should be noted that if the sides 96 and 98 were extended out to the point where they intersect, then the blunt side 94 would be the point 86. Additionally, the curved side 92 could have other shapes besides the curved shape shown in FIG. 4. For example, the curved side 92 could be a straight line parallel to the blunt side 94, or could have an irregular shape. If the curved side 92 is positioned beyond the edge of the object 103, it doesn't matter what shape the curved side 92 has. For purposes of this application, any configuration where the sides 96 and 98 are connected by the blunt side 94, or the configuration where the sides 96 and 98 intersect at the point 86 are considered to have the wedge shape 90, regardless of the shape of the curved side 92. For example, If the curved side 92 is a straight line, and the sides 96 and 98 meet at the point 86, the wedge shape 90 has the triangular shape 170 illustrated in FIG. 10.

Figure 5:
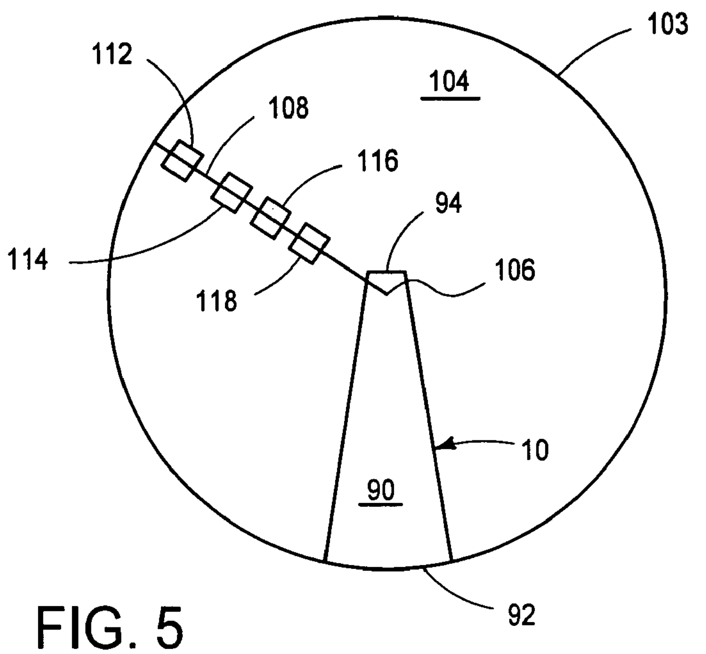
FIG. 5 is a schematic top view of the acoustic transducer according to the present invention.

For example, in FIG. 5 an object 103 (i.e., a substrate), having a circular surface 104 is rotated underneath the transducer 10 at a constant rate. A center point 106 represents the center of the surface 104 and is also the point about which rotation occurs (i.e. the axis of rotation). It is not necessary that the object 103 or the surface 104 be circular as long as they are rotated, since any rotated shape will trace out a circle. The wedge shape 90 of the crystal 24 provides the variable linear velocity correction when the surface 104 rotates underneath the wedge shape 90 (i.e. underneath the crystal 24). This correction occurs because the narrow end 102 of the wedge shape 90 delivers a smaller total amount of energy to the surface 104 than the wide end 100. This is because the power (energy/$cm^2$) transmitted by the transducer 10 is uniform but the surface area of the wide end 100 is greater than the surface area of the narrow end 102. When the object 103 is rotating, a first unit of surface area on the surface 104 that is rotating underneath the wide end 100 receives the same amount of energy from the wide end 100 as a second unit of surface area that is rotating underneath the narrow end 102, even though the first unit of surface area is moving with a greater linear velocity. With respect to rotation, it should be noted that the object 103 could be held stationary and the transducer 10 could be rotated. It is the relative motion between the object 103 and the transducer 10 that matters.

Also, in FIG. 5, it should be noted that the curved side of the wedge shape 90 is extends at least to the edge of the object 103, and may extend beyond the edge of the object 103. The blunt end 94 of the wedge shape 90 extends past the center point 106. This means that a small region around the center point 106 will not receive the same amount of acoustic energy as the rest of the surface 104. However, excluding this small region, the transducer 10 will deliver an approximately uniform amount of acoustic energy to each unit of surface area on the surface 104 in a given time period when the object 103 is being rotated. In alternative embodiments, an approximately uniform amount of acoustic energy is delivered to the region around the center point 106 by optimizing the size, shape and/or position of the narrow end 102. For example, the narrow end 102 is configured to have the point 86, as is shown in FIG. 4, and the point 86 is positioned at the center point (or axis of rotation) 106. Other factors that may impact the dose uniformity near the center point 106 include the dimension "k" of the resonator 14, the nature of the inert protection coating (if present) on the resonator 14, the distance between the substrate surface to the transducer and the substrate being processed.

In FIG. 5, a plurality of regions 112, 114, 116 and 118 on the surface 104 are illustrated. The regions 112, 114, 116 and 118 all have the same area. Because the region 112 is positioned at a larger radius from the center point 106 than the region 118, the region 112 will pass underneath the transducer 10 with a greater linear velocity than the region 118 when the object 103 is rotating. Since it is desired to have the transducer 10 deliver an equal amount of acoustic energy to the regions 112 and 114 per unit time, the total output from the transducer 10 must vary along the radius 108. If the transducer 10 has a uniform power output (watts/unit area), then increasing the surface area of the crystal 24 in the radial direction (moving from the center point 106 outwards) will give the desired increase in total energy output from the transducer. The wedge shape 90 illustrates this configuration.

FIG. 6 illustrates an embodiment of the transducer 10 where each of the layers shown in FIG. 3 have the wedge shape 90. Specifically, the third adhesion layer 80, the metal layer 82, the crystal 24, the first adhesion layer 74, the first wetting layer 72, the bonding layer 70, the second wetting layer 76, the second adhesion layer 78 and the resonator 14 all have the wedge shape 90. However, such a configuration is not required to achieve the variable linear velocity correction. In this embodiment, the only layer that must have the wedge shape 90 is the crystal 24. The other layers and the resonator 14 could have different shapes provided that they at least completely cover the crystal 24.

Figure 7:
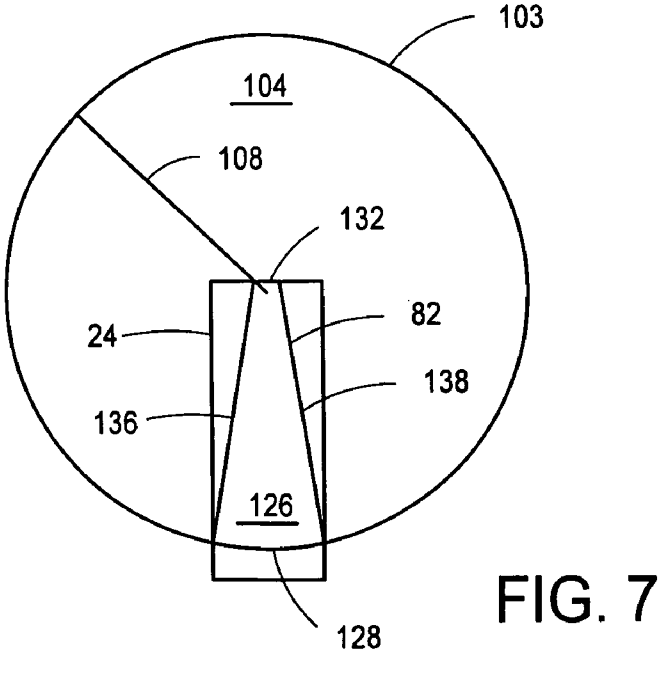
FIG. 7 is a schematic top view of the acoustic transducer according to the present invention.

FIG. 7 illustrates the second embodiment of the transducer 10 that delivers an approximately uniform amount of acoustic energy to each unit of surface area on a rotating substrate in a given time period. In FIG. 7, elements that are identical to elements described previously are represented by the same identifying numbers. In FIG. 7, the crystal 24 is rectangular in shape. The metal layer 82 has a wedge shape 126. Additionally, any other electrically conductive layers between the crystal 24 and the metal layer 82, such as the layer 80 if it is used, should have the wedge shape 126. The wedge shape 126 is the same shape as the wedge shape 90 shown in FIG. 4 and comprises a curved side 128, a blunt side 132, a first tapered side 136 and a second tapered side 138. As was described previously in FIG. 5, an object 103 having a circular surface 104, is rotated underneath the transducer 10 at a constant rate in FIG. 7. Alternatively, the transducer 10 could be rotated at a constant rate relative to the object 103. The term "relative rotational motion" is used to denote that either the object (substrate) 103 or the transducer 10 could be rotated. As was noted previously, the surface 104 does not have to be circular as long as it is rotated.

The result of giving the metal layer 82 the wedge shape 126 is the same as giving the crystal 24 the wedge shape 90. This is because the crystal 24 only emits acoustic energy from the area that is excited with an electric field. In the transducer 10, the electric field is supplied by the potential difference that exists between the metal layer 82 and the first wetting layer 72 when the RF voltage is applied to the spring connectors 22 and 26, as is explained below. Hence, when the metal layer 82 has the wedge shape 126 and covers the crystal 24, the acoustic energy emitted from the part of the crystal 24 that is underneath the layer 82 has a variable linear velocity correction along the radius 108 when the surface 104 rotates underneath the wedge shape 126 (i.e. underneath the crystal 24). Preferably, the first wetting layer 72 and any other electrically conductive layers between the bonding layer 70 and the crystal 24, such as the layer 74, also have the wedge shape 126.

Applying the metal layer 82 to the crystal 24 in the wedge shape 126 is accomplished as follows. The crystal 24 is masked with an inert material, such as Kapton® brand polyimide tape, so that a region of the crystal 24 having the wedge shape 126 is not covered by the mask. Then the metal layer 82 deposited by using a physical vapor deposition (PVD) technique, such as argon sputtering. Generally, the crystal 24 is masked before the wetting layer 80 is sputtered on, so that both the wetting layer 80 and the metal layer 82 have the wedge shape 126. Other techniques such as a plating technique can also be used to deposit the metal layer 82. Preferably, the metal layer comprises silver, but other conductive materials can be used. The same masking technique is used for giving the layers 72 and 74 the wedge shape 126.

The power for driving the crystal 24 is provided by a radio frequency (RF) generator (not shown), such as a 1000 watt RF generator. Preferably, the RF voltage applied to the crystal has a frequency in the range of approximately 925 KHz. However, RF voltages in the range of approximately 0.4 to 2.0 MHz can be used. The RF power is delivered to the transducer 10 through a coaxial cable that connects to a standard BNC or a standard RF connector, or to some other type of electrical connector, that fits in a threaded aperture 28. The RF voltage is delivered to the crystal 24 by the first spring connectors 22 and one or more of the second spring connectors 26. The BNC or RF connector is electrically connected to the PCB 25 which allows the RF voltage to be delivered to the connectors 22 and 26. Of course the coaxial cable can be electrically connected to the PCB by many other methods, such as by soldering.

The second spring connectors 26 provide an electrical connection between the PCB 58 and the layer 76 (shown in FIG. 3). The first spring connectors 54 provide an electrical connection between the PCB 58 and the layer 82 (shown in FIG. 3) on the crystal 24. With this arrangement, the plurality of first spring connectors 22 provide the active connection to the RF generator and the second spring connectors 26 provide the ground connection to the RF generator.

The transducer 10 includes the step-region 27. The step region 27 is an electrically conductive region on the resonator 14, such as the layer 76, that can be contacted by the second spring connector 26. Since all of the layers between the layer 76 and the crystal 24 are electrically conductive (i.e. the layers 70, 72 and 74), contact with the step region 27 is electrically equivalent to contact with the surface of the crystal 24 that is adjacent to the resonator 14. The first spring connectors 22 make electrical contact with the metal layer 82 to complete the circuit for driving the crystal 24. In alternative embodiments, the spring connectors 22 and 26 are not used. Instead the active connection to the RF generator is established by attaching an electrical lead to an electrically conductive layer positioned on one side of the crystal 24, such as by soldering the lead to the layer 82. The ground connection to the RF generator is established by attaching an electrical lead to the opposite side of the crystal 24, such as by soldering the lead to an electrically conductive layer, like the layer 76. Such an embodiment is described in more detail with respect to FIG. 12.

In another alternative embodiment, the crystal 24, the electrode layers 82 and 72, and the bonding layer 70 would all have the rectangular shape shown in FIG. 7. Then, only the resonator 14 would have the wedge shape 126 shown in FIG. 7. Shaping the resonator 14 in this manner would deliver an approximately uniform amount of acoustic energy to each unit of surface area on the rotating substrate in a given time period.

Figure 8:
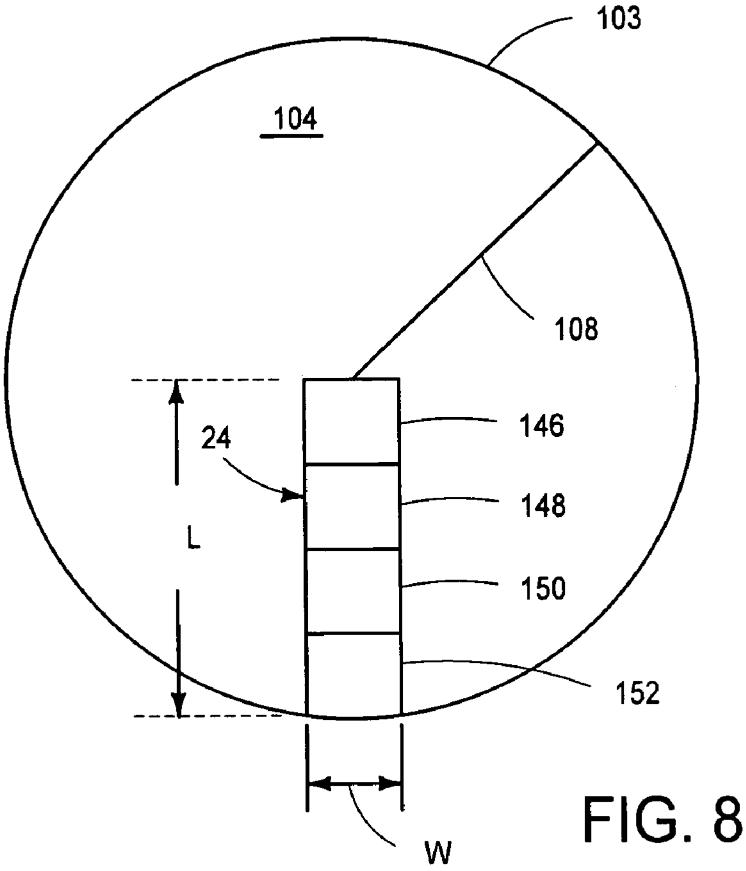
FIG. 8 is a schematic top view of the acoustic transducer according to the present invention.

FIG. 8 illustrates the third embodiment of the transducer 10 that delivers an approximately uniform amount of acoustic energy to each unit of surface area on a rotating substrate in a given time period. In FIG. 8, elements that are identical to elements described previously are represented by the same identifying numbers. In FIG. 8, the crystal 24 is rectangular in shape and has a length "L" and a width "w". Generally, the length "L" is equal to the radius 108, but the length "L" may be slightly longer than the radius 108 to ensure complete coverage of the surface 104. The crystal 24 is divided into a plurality of segments, such as a segment 146, a segment 148, a segment 150 and a segment 152. Each of the segments 146, 148, 150 and 152 comprise a separate piece of the crystal 24. In other words, the crystal 24 has been cut into four separate pieces which function as the segments 146, 148, 150 and 152. Each of the segments 146, 148, 150 and 152 are attached to the resonator 14 by a separate set of attachment layers, such as the layers illustrated in FIG. 3, so that the segments do not short circuit or electrically couple. Each of the segments 146, 148, 150 and 152 have separate electrical connections to the RF generator, such as by using separate spring connectors 22 for each segment. In this embodiment, the resonator 14 (shown in FIG. 3) is still one continuous piece.

In the embodiment illustrated in FIG. 8, the use of separately controllable segments allows the transducer 10 to be used in several ways. First, each of the segments 146, 148, 150 and 152 can have equal areas and be driven at a different power (watts/$cm^2$). The segment 152 is driven at a greater power than the segment 150. The segment 150 is driven at a greater power than the segment 148, and the segment 148 is driven at a greater power than the segment 146. The increase in power with increasing radius means that a unit of surface area on the surface 104 that passes under the segment 152 will receive the same total amount of energy as an equal unit of surface area that passes under the segment 146, even though the two units are not underneath the crystal 24 for the same amount of time. Additionally, the time that each of the segments 146, 148, 150 and 152 is on can be varied.

A second way that the transducer 10 can be used with separately controllable segments is to make the areas of the segments 146, 148, 150 and 152 different and drive each segment at a different power for a variable amount of time.

An alternate design for the embodiment illustrated in FIG. 8 is to leave the crystal 24 as one continuous piece, but to divide the metal layer 82 into separate segments analogous to the segments 146, 148, 150 and 152. The segmentation of the metal layer 82 is accomplished using the same technique that was described previously with respect to FIG. 7, for creating the wedge shape 126. The segmentation of the metal layer allows the crystal 24 to be driven at different power levels along its length for variable lengths of time in the same way that was described previously with respect to FIG. 8.

Figure 9:
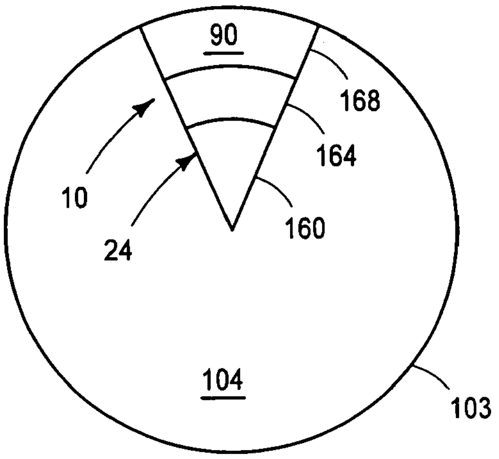
FIG. 9 is a schematic top view of the acoustic transducer according to the present invention.

FIG. 9 illustrates the fourth embodiment of the transducer 10 that delivers a uniform amount of acoustic energy to each unit of surface area on a rotating substrate in a given time period. In FIG. 9, elements that are identical to elements described previously are represented by the same identifying numbers. In FIG. 9, the crystal 24 has the wedge shape 90 described previously with respect to FIG. 4. The crystal 24 is also divided into a plurality of segments, such as a segment 160, a segment 164 and a segment 168. Each of the segments 160, 164 and 168 comprise a separate piece of the crystal 24, with each segment having the same area. The reason for combining the techniques of using the wedge shape 90 with the technique of segmenting the crystal 24 is that this allows a greater degree of control over delivering a uniform amount of acoustic energy to each unit of surface area on the rotating surface 104 in a given time period.

Each of the segments 160, 164 and 168 are attached to the resonator 14 by a separate set of attachment layers, such as the layers illustrated in FIG. 3, so that the segments do not short circuit or electrically couple. Each of the segments 160, 164 and 168 have separate electrical connections to the RF generator, such as by using separate spring connectors 22 for each segment. In this embodiment, the resonator 14 (shown in FIG. 3) is still one continuous piece.

In the embodiment illustrated in FIG. 9, the use of separately controllable segments allows the transducer 10 to be used in several ways. First, each of the segments 160, 164 and 168 can be driven at a different power (watts/$cm^2$), as was described previously with respect to FIG. 8, with the segment 168 being driven at higher power than the segment 160. The increase in power with increasing radius means that a unit of surface area on the surface 104 that passes under the segment 152 will receive the same total amount of energy as an equal unit of surface area that passes under the segment 146, even though the two units are not underneath the crystal 24 for the same amount of time. Each of the segments 160, 164 and 168 can be active for the same amount of time, or for a variable amount of time. Furthermore, each segment can be on or off at different times.

Second, each of the segments 160, 164 and 168 can be driven at the same power. However, in this embodiment the length of time that power is supplied to each segment is different. In a third use, each of the segments 160, 164 and 168 are driven at the same power, but the sequence of when a particular segment is on is varied. Usually no two segments are on at the same time, but when a segment is on, it is on for the same length of time as another segment.

An alternate design for the embodiment illustrated in FIG. 9 is to leave the crystal 24 as one continuous piece, but to divide the metal layer 82 into separate segments analogous to the segments 160, 164 and 168. The segmentation of the metal layer 82 is accomplished using the same technique that was described previously with respect to FIGS. 7 and 8. The segmentation of the metal layer allows the crystal 24 to be driven at different power levels and times along its length in the same way that was described previously with respect to FIG. 9.

Figure 10:
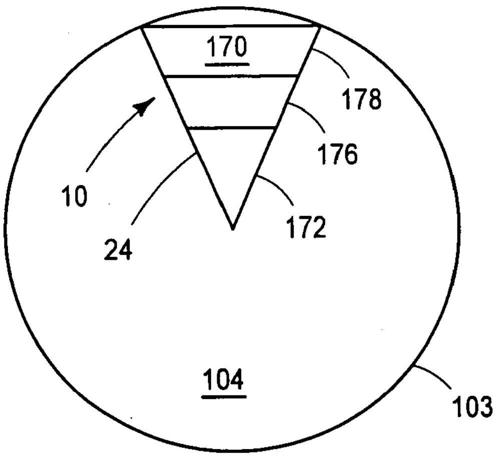
FIG. 10 is a schematic top view of the acoustic transducer according to the present invention.

FIG. 10 illustrates a variation of the embodiment shown in FIG. 9 where the crystal 24 has a triangular shape 170 instead of the wedge shape 90. The crystal 24 is divided into a plurality of segments, such as a segment 172, a segment 176 and a segment 178. Each of the segments 172, 176 and 178 comprise a separate piece of the crystal 24, with each segment having the same area. The reason for combining the techniques of using the wedge shape 90 with the technique of segmenting the crystal 24 is that this allows a greater degree of control over delivering a uniform amount of acoustic energy to each unit of surface area on the rotating surface 104 in a given time period.

Each of the segments 172, 176 and 178 are attached to the resonator 14 by a separate set of attachment layers, and have separate electrical connections to the RF generator, as was described previously with respect to FIG. 9. This permits the segments 172, 176 and 178 to be driven at a different power (watts/$cm^2$) levels for different lengths of time, as was described previously with respect to FIG. 9. Also, an alternate design for the embodiment illustrated in FIG. 10 is to leave the crystal 24 as one continuous piece, but to divide the metal layer 82 into separate segments analogous to the segments 172, 176 and 178, as was described previously with respect to FIG. 9.

Figure 11:
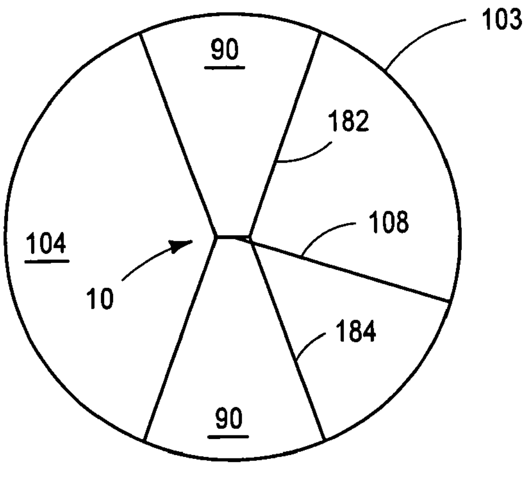
FIG. 11 is a schematic top view of the acoustic transducer according to the present invention.

FIG. 11 illustrates a variation of the transducer 10 described previously with respect to FIG. 4. In FIG. 11, elements that are identical to elements described previously are represented by the same identifying numbers. FIG. 11 illustrates that the transducer 10 can be comprised of a first crystal 182 having the wedge shape 90 and a second crystal 184 having the wedge shape 90. In this embodiment, the transducer 10 extends across the diameter of the surface 104. Each of the crystals 182 and 184 are attached to the resonator 14 as was described previously with respect to FIG. 4, and function in the same way. The crystals 182 and 184 could be rectangular in shape and the wedge shape 90 could be imparted by giving the layers 82 and 76 the wedge shape 90, as was described previously with respect to FIG. 7. Similarly, the crystals 182 and 184 could be segmented as described previously with respect to FIGS. 9 and 10.

From the discussion of FIGS. 4, 8, 9, 10 and 11, it should be clear that other shapes besides the wedge shape 90, rectangles and triangles can be used with the radial power transducer 10. In general, however the transducer 10 covers forty percent or less of the surface area of the object 103.

Another parameter that can be varied so that the transducer 10 delivers a uniform amount of acoustic energy to each unit of surface area of a rotating substrate in a given time period, is the thickness of the bonding layer 70 shown in FIG. 3. By varying the thickness of the layer 70 along the direction of the radius 108, the power emitted by the transducer 10 changes. It is thought that this phenomenon results from different reflection characteristics of the acoustic energy as the layer thickness changes.

Figure 12:
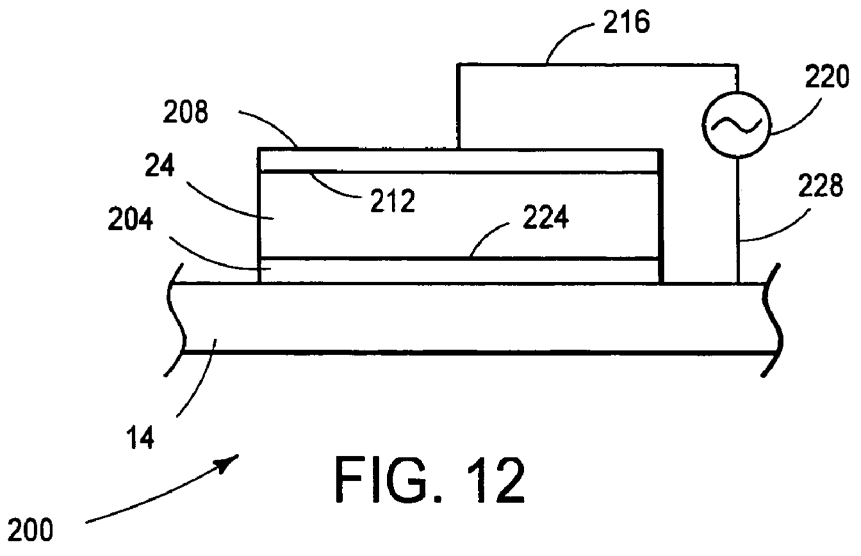
FIG. 12 is a schematic side view of an embodiment of the present invention.

FIG. 12 illustrates a preferred embodiment of the invention in which a transducer 200 is comprised of the crystal 24 and the resonator 14. The transducer 200 is similar to the transducer 10 described previously with respect to FIGS. 1–11, and elements in the transducer 200 that are identical to elements in the transducer 10 are identified by the same number. In the transducer 200, the crystal 24 is attached to the resonator 14 by an attachment layer 204.

The composition of the attachment layer 204 is not critical to the functioning of the transducer 200 and acts mainly to attach the crystal 24 to the resonator 14. The attachment layer 204 preferably comprises an electrically conductive material, such as an electrically conductive epoxy, but other materials such an electrically nonconductive epoxy or an electrically conductive or electrically nonconductive non-epoxy adhesive, such as a glue, may also be used. Additionally, the attachment layer 204 may comprise a solder-like material such as indium or tin as was described previously with respect to FIGS. 3 and 6. A suitable electrically conductive epoxy is a silver filled epoxy such as the product marketed under the name Loctite® 3888. The term epoxy means a resin capable of acting as an adhesive, such as a resin made by copolymerization of an epoxide and a second compound, as is well-known in the art.

In the transducer 200, an electrically conductive layer 208 is positioned along a back surface 212 of the crystal 24. The electrical connections to the crystal 24 are made by attaching an electrical lead 216 to the layer 208, such as by soldering the lead 216 to the layer 208. The lead 216 is also connected to the active terminal of a radio frequency (RF) generator 220, such as a 1000 watt RF generator capable of generating RF voltages in the frequency range of 0.4 to 2.0 megahertz (MHz). A front surface 224 of the crystal 24 needs to be grounded in order for the crystal 24 to be excited by the RF generator 220.

There are several ways to ground the surface 224. In a preferred embodiment, the resonator 14 and the attachment layer 204 are both comprised of an electrically conductive material. In this situation, the ground terminal of the RF generator 220 is connected to the resonator 14 by an electrical lead 228, thereby grounding the surface 224. For example, the attachment layer 204 may comprise an electrically conductive epoxy and the resonator 14 may comprise aluminum coated with a chemically inert material.

In other embodiments, such as when the resonator 14 or the attachment layer 204 comprise an electrical nonconductive material, the surface 224 is grounded in other ways. For example, an electrically conductive layer, such as the layer 72 described previously with respect to FIG. 3 is positioned along the surface 224 and the lead 228 is connected to the layer 72.

Figure 13:
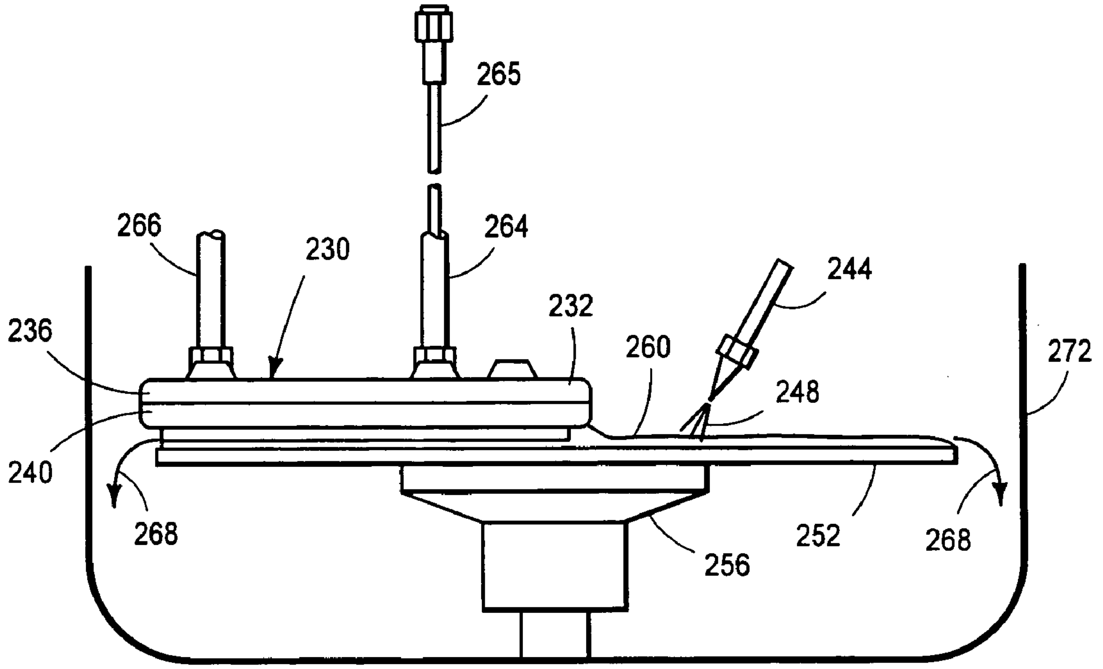
FIG. 13 is a schematic side view of a system that utilizes the present invention.

FIG. 13 illustrates a system 230 that utilizes the transducer 200. In the system 230, the transducer 200 is incorporated into a fluid tight vessel 232 that completely surrounds the crystal 24. The vessel 232 comprises a top part 236 and a bottom part 240. A process fluid supply source 244 dispenses a stream of process fluid 248 onto an item 252 having a circular surface 104, such as was described previously with respect to FIGS. 7–11. The item 252 is rotated on a rotating chuck 256 and the rotation causes a thin layer 260 of the process fluid 248 to form uniformly between the surface 104 and the bottom part 240. A fitting 264 provides access for a coaxial cable 265. The coaxial cable 265 provides the electrical connections (i.e. the leads 216 and 228 shown in FIG. 12) between the transducer 200 and the RF generator 220. In other words, the cable 265 acts as the leads 216 and 228 shown in FIG. 12. A fitting 266 provides an inlet for introducing an inert purge gas, such as nitrogen or clean dry air into the inside of the vessel 232. The purge gas exits through the fitting 264. The purge gas establishes a positive pressure inside the vessel 232 to enhance the safety of the device, such as by keeping fluid from seeping into the vessel 232 if a leak should develop. The arrows 268 indicate that the process fluid is spun off of the item 252 and contained in a vessel 272.

In FIG. 13, the item 252 is typically a semiconductor wafer in some stage of an integrated circuit manufacturing process. However, the identity of the item 252 is not part of the invention and could be any item having a surface 104 that needs to be exposed to acoustic energy, either for cleaning or for some other purpose, such as for facilitating a chemical reaction.

Figure 14:
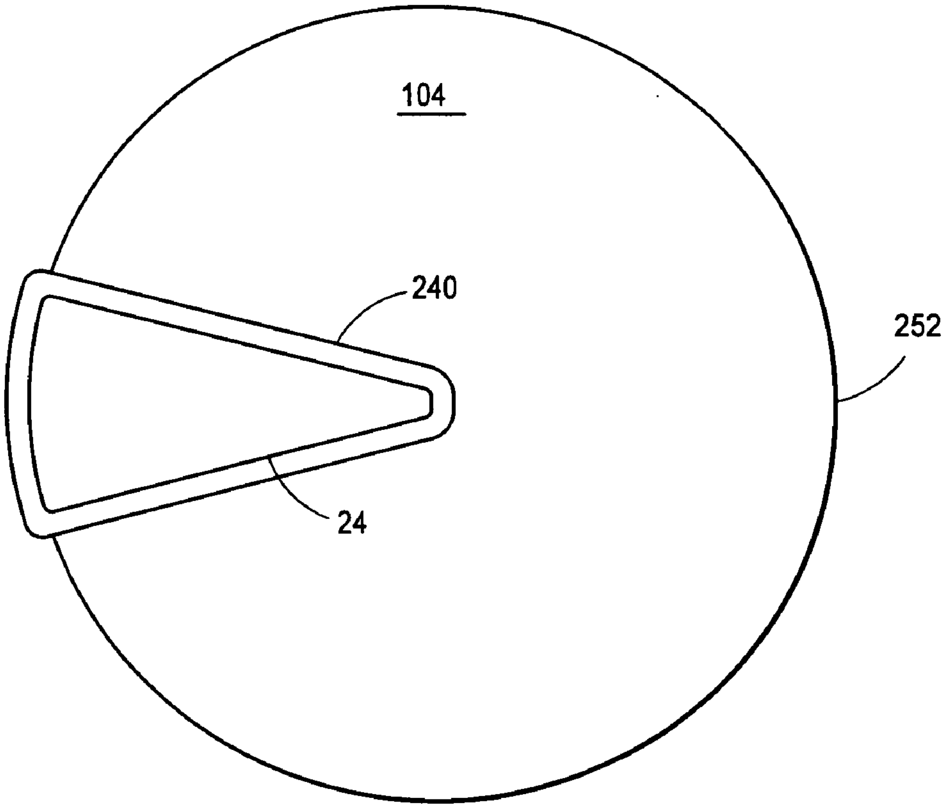
FIG. 14 is a schematic top view of the acoustic transducer according to the present invention.

FIG. 14 illustrates the system 230 positioned over the circular surface 104 of the item 252. In FIG. 14, the top part 236 is not shown so that the crystal 24 positioned on the bottom part 240 can be seen. The bottom part 240 and the crystal 24 each have the wedge shape 90. However, the dimensions of the bottom part 240 are chosen so that the bottom part 240 extends beyond the crystal 24 in a plane that is parallel to the surface 104. In this embodiment, the resonator 14 is the region of the bottom part 240 that is positioned underneath of the crystal 24.

In the preferred embodiment, the vessel 232 is comprised of aluminum coated with a chemically inert material, such as the polymers perfluoroalkoxy (PFA), polytetrafluoroethylene (PTFE), fluorinated ethylene-propylene (FEP), or tetrafluoroethylene (TFE) and other formulations, including the materials that are marketed under the trademark Teflon™; the fluorinated polymer ethylene chlorotrifluoroethylene (ECTFE), including the material marketed under the trademark Halar™; or the fluorinated polymer polyvinylidene fluoride (PVDF), including the material marketed under the trademark Kynar™. The crystal 24 is attached to the bottom part 240 with an electrically conductive epoxy and the ground terminal of the RF generator 220 is connected to the vessel 232, thereby grounding the surface 224. Preferably, the ground terminal of the RF generator is connected to the vessel 232.

The transducers 10 and 200 are used in megasonic cleaning processes (or other processes where a liquid chemical is applied to the surface of the substrate), where an approximately equal amount of acoustic energy must be delivered to each unit of surface area on the rotating substrate in a given time period to assist in the cleaning or chemical process. It is clear that the transducers 10 and 200 can be formed in many ways. Stated generally, the transducer comprises an acoustic energy generating means for generating acoustic energy in the frequency range of 0.4 to 2.0 MHz. The acoustic energy generating means has a surface area that is less than the surface area of the substrate and delivers an approximately uniform amount of acoustic energy to each unit of surface area on the substrate in a given time period when a relative rotational motion exists between the substrate and the transducer. A resonator is attached to the acoustic energy generating means for transmitting the acoustic energy to the substrate through the liquid used in the cleaning process. The acoustic energy generating means may take many forms, including the wedge shaped crystal shown in FIGS. 4–6, 11 and 14, the rectangular crystal with wedge shaped electrodes shown in FIG. 7, the rectangular crystal with separately controllable segments shown in FIG. 8, or the wedge shaped crystal with separately controllable segments shown in FIGS. 9 and 10.

The transducers 10 and 200 are especially useful for cleaning individual items that are difficult to clean in a batch process. Such items include large semiconductor wafers, such as those having a diameter in the range of one hundred and fifty millimeters to three hundred millimeters or more, semiconductor wafers from a low production run, such as for custom made or experimental chips, flat panel displays, and other large flat substrates.

The cleaning process for cleaning individual items of this type involves applying a cleaning or process fluid to the surface of the object and then rotating the object underneath the transducer 10 or 200. Acoustic energy emitted from the resonator 14 is transmitted into the process fluid and causes cleaning to occur. In alternate methods, the transducer 10 or 200 can be rotated and the object held stationary, or both can be rotated.

In practice, different process fluids are used for different cleaning tasks. The exact composition of many process fluids is proprietary to the companies that manufacture the fluids. However, typical process fluids include deionized water, aqueous solutions of ammonium hydroxide, hydrogen peroxide, hydrochloric acid, nitric acid, acetic acid, or hydrofluoric acid, and combinations of these reagents. Commonly used process fluid compositions are referred to as SC-1 and SC-2.

The reason an approximately equal amount of acoustic energy must be delivered to each unit of surface area on a rotating substrate in a given time period is that the effectiveness of the cleaning or chemical process varies with the amount of acoustic energy that is transmitted into the fluid. Therefore, if different areas on the surface of a wafer receive different amounts of acoustic energy, the degree of cleaning may vary. This is particularly true in cases where the chemistry of the process fluid is assisting in the cleaning action. In such situations, the use of the transducer 10 is desirable.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

We claim:

1. A transducer comprising:

an acoustic energy generating means for generating acoustic energy, the acoustic energy generating means being adapted for delivering an approximately uniform amount of acoustic energy in a given time period to each unit of surface area on a particular surface of a substrate to be exposed to the acoustic energy when a relative rotational motion about an axis of rotation exists between the substrate and the transducer, the acoustic energy generating means including a design feature that corrects for the increase in linear velocity of points on the particular surface with increasing distance from the axis of rotation, the acoustic energy generating means overlying less than 100% of the particular surface; and a resonator attached to the acoustic energy generating means for transmitting the acoustic energy to the substrate.

2. The transducer of claim 1 wherein the acoustic energy generating means comprises a piezoelectric crystal and the design feature comprises a wedge shape of the piezoelectric crystal in which a first end of the piezoelectric crystal is wider than a second end of the piezoelectric crystal.

3. The transducer of claim 1 wherein the acoustic energy generating means comprises an assembly comprised of two or more piezoelectric crystal segments and the design feature comprises a wedge shape of the assembly in which a first end of the assembly is wider than a second end of the assembly.

4. The transducer of claim 1 wherein the acoustic energy generating means comprises a piezoelectric crystal having at least one electrode and the design feature comprises a wedge shape of the electrode in which a first end of the electrode is wider than a second end of the electrode.

5. The transducer of claim 1 wherein the resonator comprises a material selected from the group consisting of quartz, sapphire, silicon carbide, silicon nitride, ceramics, aluminum and stainless steel.

6. The transducer of claim 1 further comprising:

an attachment layer positioned between the acoustic energy generating means and the resonator for attaching the resonator to the acoustic energy generating means.

7. The transducer of claim 6 wherein the attachment layer comprises a material selected from the group consisting of indium, tin, indium alloys and tin alloys.

8. The transducer of claim 6 wherein the attachment layer comprises a material selected from the group consisting of electrically conductive epoxy, electrically nonconductive epoxy and non-epoxy adhesive.

9. The transducer of claim 1 wherein the substrate comprises a semiconductor wafer.

10. The transducer of claim 1 wherein the relative rotational motion is caused by rotating the substrate.

11. The transducer of claim 1 wherein the acoustic energy generating means comprises a piezoelectric crystal and the design feature comprises a wedge shape of the piezoelectric crystal, the wedge shape comprising a planar surface of the piezoelectric crystal comprised of a first side, a second side and a curved side, with an angle separating the first side from the second side, and the curved side connecting the first side and the second side, with the angle chosen so that the piezoelectric crystal overlies forty percent or less of the particular surface.

12. The transducer of claim 1 wherein the acoustic energy generating means comprises a piezoelectric crystal and the design feature comprises a wedge shape of the piezoelectric crystal, the wedge shape comprising a three-dimensional structure having a top planar surface that is bounded by a first side and a second side, with the first side and the second side each being approximately straight lines when viewed in two dimensions, with the first side and the second side being nonparallel so that an angle is formed between the first side and the second side.

* * * * *